United States Patent [19]

Krivanek

[11] Patent Number: 4,851,670

[45] Date of Patent: Jul. 25, 1989

[54] ENERGY-SELECTED ELECTRON IMAGING FILTER

[75] Inventor: Ondrej L. Krivanek, Oakland, Calif.

[73] Assignee: Gatan Inc., Pleasanton, Calif.

[21] Appl. No.: 90,443

[22] Filed: Aug. 28, 1987

[51] Int. Cl.⁴ .............................................. H01J 49/44
[52] U.S. Cl. ..................................... 250/305; 250/311; 250/396 ML
[58] Field of Search ........... 250/396 R, 396 ML, 305, 250/311, 281

[56] References Cited

U.S. PATENT DOCUMENTS

| | | | |
|---|---|---|---|
| 3,256,433 | 6/1966 | Watanabe et al. | 250/305 |
| 3,979,590 | 9/1976 | Anderson | 250/311 |
| 4,006,895 | 1/1978 | Iwanaga | 250/396 R |
| 4,191,887 | 3/1980 | Brown | 250/396 R |
| 4,414,474 | 11/1983 | Creive | 250/396 R |
| 4,486,664 | 12/1984 | Wollnik | 250/292 |
| 4,612,440 | 9/1986 | Brunnée et al. | 250/281 |
| 4,743,756 | 5/1988 | Krivanek | 200/305 |

Primary Examiner—Bruce C. Anderson

[57] ABSTRACT

Quadruple lenses 30, 31 and 32 and sextupole lenses 40, 41, 42, and 43 are interposed between a energy-dispersing device 17 and an electron imaging device 50 in an energy-selected electron imaging filter. The energy-dispersing device produces a focussed spectrum 21 of electron energies in the plane of an energy-selecting slit 20, and the quadrupole and sextupole lenses transform the spectrum into an energy-selecting slit may also be either removed or opened wide, and the quadrupole lenses may be refocussed, so that the electron imaging device directly observes a magnified spectrum of the electron energies.

9 Claims, 6 Drawing Sheets

ENERGY-SELECTED ELECTRON IMAGING FILTER

BACKGROUND OF THE INVENTION

1. Field of the Invention

The invention relates to an energy-selected electron imaging filter including a device for dispersing electrons according to their energies such as a magnetic sector, a device for selecting a small pass-band of electron energies such as a metal slit, several quadrupole and sextupole electron lenses which produce an image with the selected electrons, and an electron imaging device such as a scintillator coupled to a charge-coupled-device camera.

2. Description of Prior Art

Modern electron microscopes are capable of imaging individual atoms in a thin sample, but the images produced by the microscope alone contain no direct information on the chemical composition of the sample, and the image quality degrades significantly if the sample is more than a few atomic planes thick. The chemical information can be provided by selectively imaging only with electrons that have, while traversing the sample, experienced energy losses characteristic of particular atomic species. This means that electrons that have experienced energy losses outside a selected energy pass-band are filtered out, and the energy spread of the electron beam used to form the image is considerably reduced. The image quality, normally degraded by the chromatic aberration of the imaging lenses, is thereby significantly improved.

The energy filtering can be performed in two different ways. The electron beam incident on the sample can be focussed into a narrow probe, which is a raster-scanned across the sample, and the energies of the transmitted electrons can be analyzed at each probe position by an electron energy-loss spectrometer. In this case the energy-filtered image is formed image point by image point, and the recording time for an energy-selected image of 500 by 500 image points is typically around 1 hour. A faster approach is to illuminate the sample with a broad electron beam, and produce an energy-selected image by an apparatus which forms a focussed spectrum of electron energies, selects an energy pass-band, and transforms the spectrum back into an image. Such an apparatus is frequently called an energy-selected electron imaging filter. Attached to a high-performance transmission electron microscope, filters of this type can produce elemental-concentration maps containing a large number of image points in a few seconds. They can also substantially improve the resolution of transmission electron images of thicker samples. This is especially important for biological samples, which can normally only be prepared several hundreds to several thousands of atomic planes thick.

The electron-optical properties of the energy-selected electron imaging filter must be such that the image quality is not noticeably degraded compared to an electron microscope not equipped with such a filter. Prior-art energy-selecting electron imaging filters therefore typically consisted of many independent energy-dispersing and aberration-correcting optical elements, arranged such that large aberations produced by any individual element were cancelled by the combined action of the remaining elements. An example of such a design is described by Rose et al. in Optik vol. 54, pp. 235-250 (1979), hereby incorporated by way of reference. This design comprises four deflecting magnetic sectors, each with specially selected angles and curvatures of entrance and exit faces, three electromagnetic sextupole lenses of adustable strength and polarity, and it further requires at least one round magnetic lens placed after the filter. The design features 7 design parameters which must be independently optimized. The electron path through the filter is relatively complicated, and a small deviation from the ideal path results in a significant degradation of the energy selected image. As a result, this type of energy-selected electron imaging filer has been found very difficult to align. Another complication with this design is that it must be incorporated into the imaging column of the electron microscope. This makes it impossible to install this type of filter as an accessory to an otherwise unmodified electron microscope.

Another example of a design which must be icorporated in the microscope imaging column is the Castaing-Henry filter described by Caistaing et al. in Comptes Rendus d'Académie des Sciences (Paris), vol. 255, pp. 76-78 (1962), hereby also included by way of reference. This design comprises a single magnetic sector, and an electrostatic mirror which causes the electron beam to traverse the sector two times. A major disadvantage of this design is that electrostatic discharges prevent the mirror from operating satisfactorily at electron energies greater 100 keV, while microscopes most suited to energy-selected imaging typically utilize electrons of energies from 200 keV to 400 keV.

Simple designs of energy-selected electron imaging filters also exist, which make no provision for the correction of image aberrations. However,these designs produce highly distorted and aberrated images whose quality becomes unacceptable for image fields as small as 500 by 500 image points.

SUMMARY OF THE INVENTION

The present invention solves the problems associated with the prior-art devices by employing a single magnetic sector to disperse the elecrons according to their energies, a set of quadrupole lenses to transform the dispersed energy spectrum into an energy-selected image, and a set of sextupole lenses to correct the most important image distortions and aberrations. The use of the quadrupole lenses leads to an energy-selected electron imagng filter which produces images of good quality for image fields exceeding 1000 by 1000 independent image points, which can operate at any electron energy permitted by the electron microscope, and which can be easily attached to any s tandard transmission electron microscope.

According to the invention, three or more magnetic or electrostatic quadrupole electron lenses of variable power and polarity are disposed between an energy-dispersing device such as a magnetic sector or an electrostatic sector, and an electronimaging device such as a scintillator fiber-optically coupled to a charge-coupled device (CCD) camera. The invention also comprises a means for selecting a part of the energy spectrum produced by the energy-dispersing device, such as metal slit of adjustable width, which is disposed after the energy-dispersing device. The power and the polarities of the quadruple lenses may be adjusted so that the image produced at the electron imaging device shows no first-order dependence on the electron energy, and the magnification of the image may be varied independently in two perpendicular directions. In addition, one or more sextupole lenses may be interposed between the energy-dispersing device and the electron imaging device, and their strength and polarity may be adjusted so that the second-order image distortions and aberrations which most affect the quality of the energy-selected image can be eliminated.

A major advantage of the present invention is that the central electron ray follows a relatively simple trajectory through the energy-dispersing device and the subsequent quadrupole and sextupole lenses, which makes for straightforward alignment. Another major advantage of the invention is that magnetic quadrupole lenses are typically 10 times lighter and consume 10 to 100 times less power than the magnetic round lenses which must be used after the energy-selected electron imaging filters incorporated into the microscope imaging column. A further advantage of the invention is that it can be easily attached at the end of the electron microscope imaging column without requiring any major modification to the microscope, and that when it is not in use, the microscope will function precisely as it would without the attachment of the energy-selected electron imaging filter.

Yet another major advantage of the present invention is that if the means for selecting the electron energies is either removed from the electron path or opened so wide that the pass-band of electron energies includes an appreciable portion of the spectrum of electron energy losses, the quadrupole strengths and polarities may be chosen so that a focussed spectrum of electron energies is produced at the electron imaging device In this operating mode, a whole electron energy-loss spectrum is recorded at the same time. The invention may therefore also operate as a parallel-detection electron energy-loss spectrometer.

BROAD DESCRIPTON OF THE DRAWINGS

For a better understanding of the present invention, reference may be had to the following detailed description taken with the accompanying drawings in which.

Figure 1:
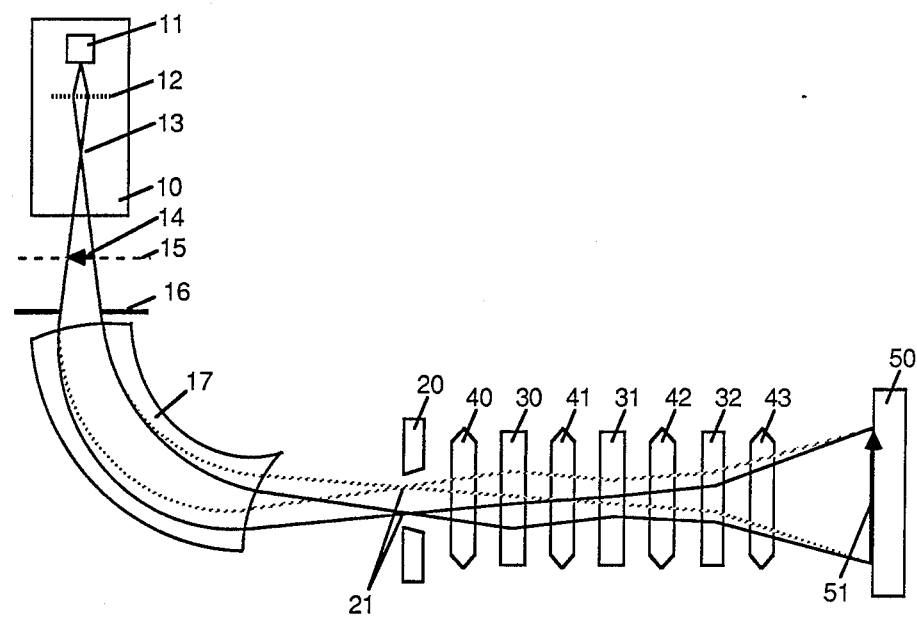
FIG. 1 shows a schematic view in the dispersion plane of an energy-selected electron imaging filter according to the present invention.

DRAWING REFERENCE NUMERALS 10 electron microscope column
11 electron gun
12 specimen
13 electron beam crossover
14 unfiltered image
15 removable fluorescent screen
16 aperture
17 energy-dispersing device
20 slit
21 energy-loss spectrum
30 quadrupole lens
31 quadrupole lens
32 quadrupole lens
40 sexutpole lens
41 sextupole lens
42 sextupole lens
43 sxtupole lens
50 electron imaging device
51 final image
52 arrival point of higher energy electrons
53 arrival point of lower energy electrons
54 undistorted energy-selected image
55 distorted energy-selected image
56 distorted energy-selected image
57 undistorted energy selected image
58 distorted energy-selected image
59 aberrated energy-selected image
60 magnetic pole
61 coil
62 bobbin
63 current leads
64 magnetic yoke
65 drift tube
70 magetic pole
71 coil
72 bobbin
73 current leads
74 agnetic yoke

DETAILED DESCRIPTION OF THE PREFERRED EMBODIMENTS

Referring to FIG. 1, the energy-selected electron imaging filter comprises an energy-dispersing device 17 which disperses electrons according to their energy, an energy-selecting slit 20 of adjustable width, three magnetic qudrupole lenses 30, 31 and 32, four magnetic sextupole lenses 40, 41, 42, and 43, and an electron imaging device 50. The electrons originate from an electron gun 11 inside an electron microscope column 10. They pass through a thin specimen 12 and are focussed into a final crossover 13, which is typically located in the back-focal plane of the final lens of the electron microscope. The electrons pass through the crossover and spread out to form an unfiltered electron image 14. The crossover 13 is typically less than 5 $\mu$m in diameter, and this gives a very large depth of focus to the unfiltered image. The image can therefore be observed at various distances below the crossover, e.g. on the removable fluorescent screen 15 or at the level of the entrance aperture 16 into the energy-selected electron imaging filter.

Depending on the chosen operating regime and the type of the electron microscope, the electron beam produced by the electron gun has a mean energy typically between 20 keV and 1 MeV, and an energy spread of around 1 eV. On passing through the thin specimen 12, the electrons suffer various energy losses characteristic of the elements present in the sample, and the electron beam entering the energy-selected electron imaging filter contains electrons of energies ranging from the high primary energy down to zero energy. To obtain an image of the chemical distribution of a particular chemical element without incurring artifacts due to the background in the energy-loss spectrum caused by other elements present in the sample, typically three images are taken with energy pass-bands around 30 eV wide centered on an energy losses ranging from 100 eV to 2 keV, and the chemical image is formed by scaling and subtracting two of the images from the third. To obtain an improved image of a thick specimen, the energy pass-band is typically narrowed down to 10 eV and centered on the electrons that have lost no energy in traversing the sample.

Having passed through the entrance aperture 16, the electrons enter the energy-selected electron imaging filter. The aperture defines the angular spread of the electrons entering filter, and it also defines which portion of the larger unfiltered image observable on the removable fluorescent screen 15 will be imaged through the filter. Inside the filter, the electrons pass through an energy-dispersing device 17, which produces a focussed energy spectrum 212 located at the level of an energy-selecting slit 20 of adjustable width. The slit intercepts electrons of all energies other than those in a narrow pass-band. The width of the pass-band is defined by the physical width of the slit opening, and the center of the pass-band is defined by the adjustable bending strength of the energy-dispersing device. The preferred energy-dispersing device 17 is a single magnetic sector whose entrance and exit polefaces are at such angles to the electron beam, and of such curvatures, that its energy resolution remains better than 1 part in 100,000 for an electron beam of an angular width of several mrad entering the magnetic sector, and that the focal plane of the dispersed energy spectrum lies at a right angle to the direction of electron travel.

Interposed between the energy-selecting slit 20 and the electron imaging device 50 are quadrupole lenses 30, 31 and 32, and sextupole lenses 40, 41, 42, and 43. The peferred electron imaging device consists of a thin single-crystal electron scintillator which is fiber-optically coupled to a two-dimensional charge-coupled-device camera. However, any means suitable for the detection of two-dimensional electron images can be used as the imaging device 50, including but not limited to any type of light camera optically coupled to an electron scintillator, photographic film directly exposed to the electron beam, a fluorescent screen directly observed by the operator, or a two-dimensional solid-state detector directly exposed to the electron beam.

The combined action of the electron lenses 30 through 43 transforms the dispersed electron energy spectrum 21 into a final energy-selected image 51. The electron trajectories shown in FIG. 1 in solid lines are those of higher-energy electrons relative to the electrons whose trajectories are shown by dotted lines. It can be seen that if the quadrupoles are suitably energizied, the energy dispersion produced by the energy-dispersing device 17 is cancelled so that the image 51 shows no first-order dependence on the electron energy.

Figure 2:
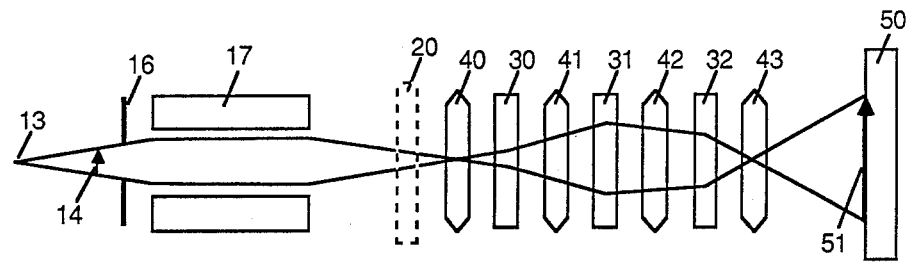
FIG. 2 shows the electron trajectories in the plane which contains the central electron ray and is perpendicular to the energy-dispersion plane.

FIG. 2 shows the electron trajectories in the plane perpendicular to the dispersion plane shown in FIG. 1. A quadrupole lens which converges an electron beam in the dispersion plane diverges the beam in the perpendicular plane, and the electron trajectories in the two planes are therefore very different. Nevertheless, by energizing the quadrupole lenses suitably, the magnification of the image 51 produced at the level of the electron imaging device 50 is chosen to be precisely equal in the two planes, so that the appearance of the final image is qualitatively indistinguishable from an image produced by a round lens.

The sextupole lenses serve primarily to cancel distortions and aberrations of the final image. Their action cannot be explained by a simple diagram of the electron trajectories. However, their action is readily understood by using the beam matrix approach described by Brown et al. in the report 80-04 published by the European Organization for Nuclear Research in Geneva, Switzerland (1980), hereby incorporated by way of reference.

Figure 3:
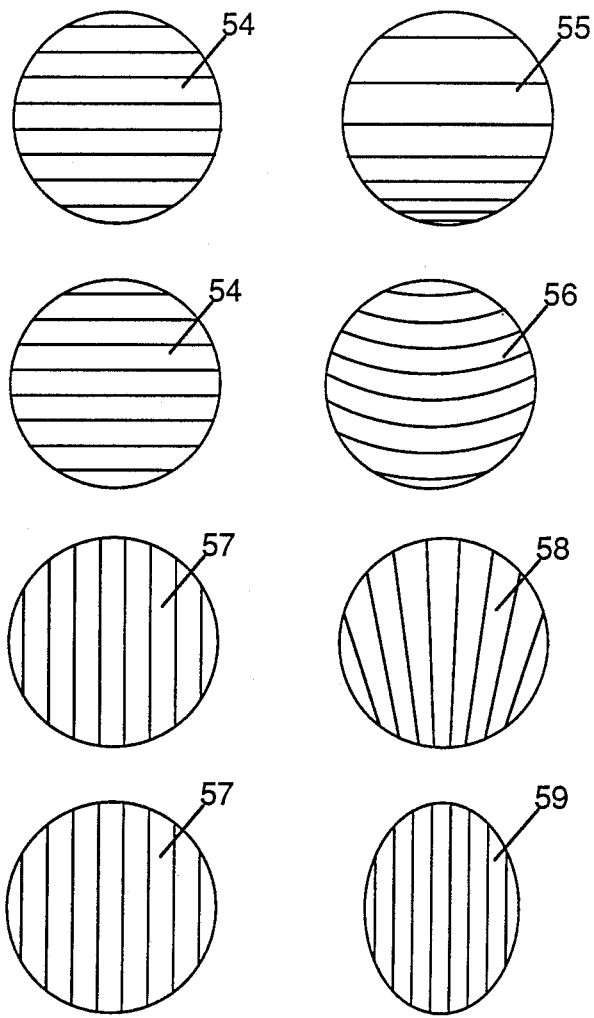
FIG. 3 shows the principle second-order distortions and aberrations which may arise in the energy-selected image.

FIG. 3 illustrates the three types of second-order image distortion and one second-order image aberration that most degrade the quality of the energy-selected image. In each pair of images the left, image shows the idealized unaberrated image of a suitable test object, and the right image shows the effect of the distortion or aberration. The distorted images are shown as they would be observed by the electron imaging device 50, and are oriented so that the dispersion direction is vertical.

The microscope sample most suitable for examining image distortions typically display a set of parallel and equidistant straight lines, such as the lattice fringes corresponding to atomic planes observable in most crystalline specimens at high resolution. An undistorted image 54 of parallel and equidistant straight lines running perpendicular to the dispersion direction can be distorted in two ways by the energy-selected electron imaging filter as shown by images 55 and 56, and an undistorted image 57 of parallel and equidistant straight lines running in the dispersion direction can be distorted as shown by the image 58. The effect of the most important second-order image aberration is to change the magnification in the non-dispersion direction depending on the electron energy, so that the undistorted image 58 will be faithfully reproduced with electrons of one energy, but for electrons a different energy it will appear as the image 59. Using the beam matrix approach and the notation of Brown et al., and specifying the negligibly small crossover 13 as the origin of the coordinate system which describes the electron beam entering the imaging filter, the four above terms are denoted as $T_{1,2,2}$, $T_{1,4,4}$, $T_{3,2,4}$, and $T_{3,4,6}$ respectively. The numerous other second-order distortions and aberrations possible in a general imaging system are not important for the imaging filter of the invention, either because they are excluded due to the mirror symmetry of the filter about the dispersion plane, or because the electrons go through the negligibly small crossover 13, or because the optical properties of the energy-dispersing device 17 are such as to make them small. The four distortion and aberration terms $T_{1,2,2}$, $T_{1,4,4}$, $T_{3,2,4}$, and $T_{3,4,6}$ can all be corrected simultaneously by a set of four sextupole lenses, provided that the shape and the energy-dispersion of the electron beam entering any one of the sextupoles are markedly different from the shape and energy-dispersion of the beam at the other sextupoles.

In the apparatus of the invention, the four second-order distortions and aberrations are corrected by the sextupole lenses 40 through 43, which are arranged such that the sextupoles 41, 42 and 43, which follow the first sextupole 40, are each disposed after a quadrupole lens which changes the shape and energy dispersion of the electron beam. The correct excitation of the sextupole lenses can be found experimentally by imaging a test object such as the lattice planes in a crystalline specimen, and selecting the quadrupole and sextupole lens excitations in a two-step process, in which the quadrupole excitations are adjusted first to give the first-order focussing properties depicted schematically by the electron trajectories in FIGS. 1 and 2, and then the sextupole excitations are adjusted so that the distortions and aberration depicted in FIG. 3 are eliminated. This ensures that the quality of the energy-filtered image is not noticeably degraded relative to the quality of an unfiltered image for image fields exceeding 1000 by 1000 indepndent image points.

The sextupole lenses can also be either altogether omitted or their number reduced below 4. In this case it is only possible to either eliminate some but not all of the important distortions and aberrations, or preferably, to balance the important aberrations against each other so that their total effect on the energy-selected image is minimized. Even if no sextupole lenses are provided at all, the distortion of an energy-selected image consisting of 500 by 500 independent image points is only a few percent, i.e. it is comparable to the distortion of the whole unfiltered image observable on the projection screen of a standard transmission electron microscope not equipped with an energy-selected electron imaging filter.

Figure 4:
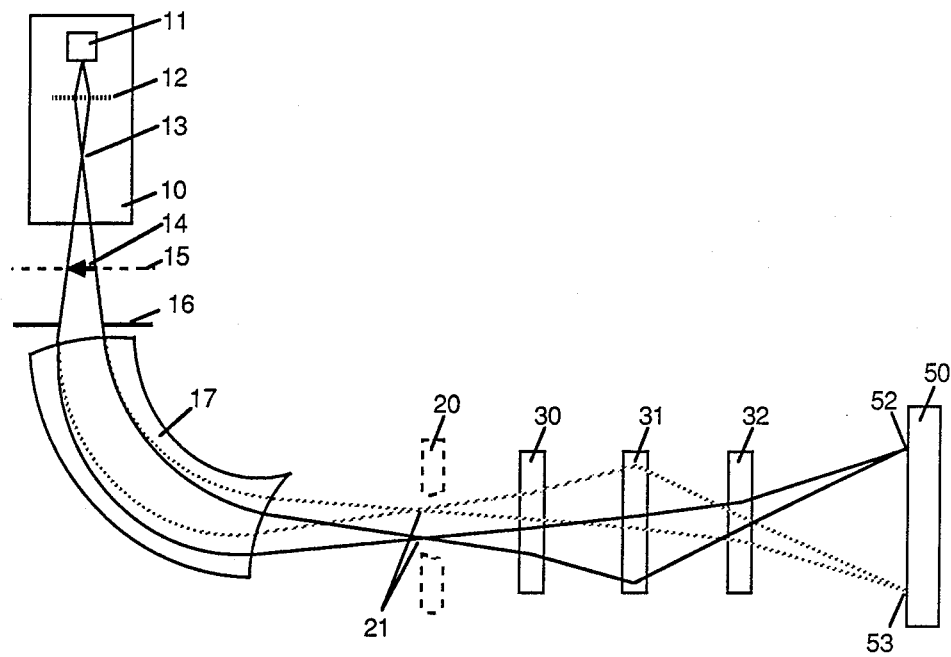
FIG. 4 shows the electron trajectories in the dispersion plane when a focussed spectrum of electron energies is produced at the electron imaging device.

FIG. 4 shows schematically that if the strengths and polarities of the quadrupoles are changed suitably, a focussed image of the energy-loss spectrum, in which electrons of different energies are separated into arrival points 52 and 53, is produced at the electron imaging device 50. The sextupole lenses are not essential for this function, and have therefore been left out from the diagram. The ability to examine the energy-loss spectrum rather than the image of the sample is essential for fine-tuning the focus of the spectrum 21 produced at the energy-selecting slit 20, and for the correct selection of the energy pass-band to be used in the energy-selected imaging. When the width of the energy-selecting slit is kept small, the image of the spectrum is cut off by the slit edges, and the selected energy pass-band is directly observable by the electron imaging device. When the slit is opened wide or altogether removed from the path of the electron beam, the electron imaging device records a complete energy-loss spectrum, which is useful for quantitative chemical analysis of the selected specimen area.

Figure 5:
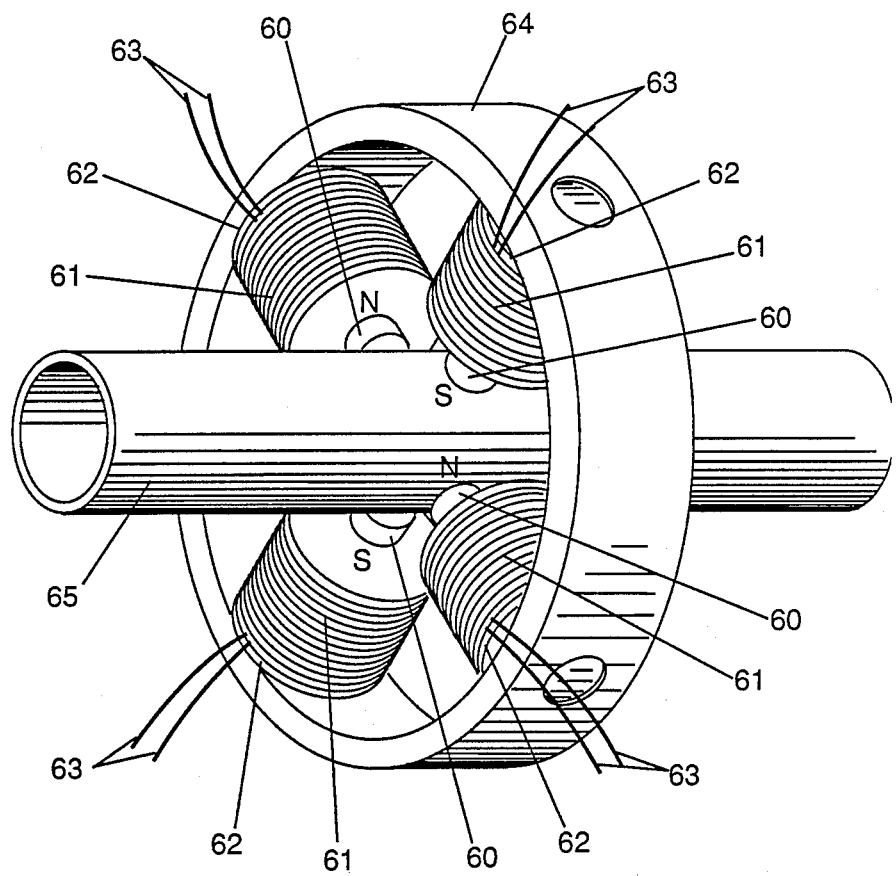
FIG. 5 shows a perspective view of an embodiment of the magnetic quadrupole lens.

FIG. 5 shows an embodiment of a magnetic quadrupole lens suitable for any of the quadrupole lenses 30 through 32. The embodiment comprises four electromagnetic coils 61 wound onto bobbins 62, each coil having a magnetic pole 60 made from a soft magnetic material. The poles 60 are arranged at 90° to each other, and each pole axis makes an angle of 45° with respect to the energy-dispersion plane. The electromagnetic coils are supplied with a variable current through leads 63 in such manner that they are excited equally in strength, but alternate in polarity so that coils at 180° to each other produce two south poles facing each other, and the remaining two coils produce two north poles. The return path for the magnetic field is provided by a magnetic yoke 64. Electrons pass through the quadrupole via a drift tube 65, which is made from a non-magnetic material, and is evacuated.

Figure 6:
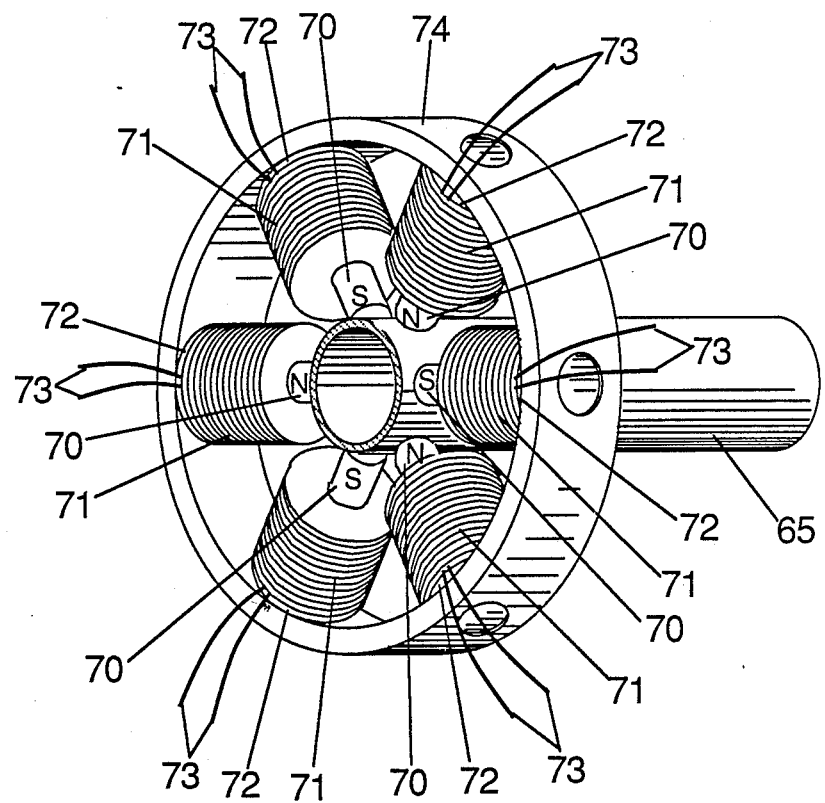
FIG. 6 shows a perspective view of an embodiment of the magnetic sextupole lens.

FIG. 6 shows an embodiment of a magnetic sextupole lens suitable for any of the sextupole lenses 40 through 43. The embodiment comprises six electromagnetic coils 71 wound onto bobbins 72, each coil having a magnetic pole 70 made from a soft magnetic material. The poles 70 are arranged at 60° to each other, such that two of the poles are at right angles to the energy-dispersion plane. The electromagnetic coils are supplied with a variable current through leads 73 in such manner that they are excited equally in strength, but alternate in polarity. The return path for the magnetic field is provided by a magnetic yoke 74. Electrons pass through the sextupoles via the drift tube 65, whichis shared with the quadrupole lenses.

While the above contains many specifities, the reader should not construe these as limitations on the scope of the invention, but merely as exemplifications of the preferred embodiment thereof. Those skilled in the art will envision many other possible variations within its scope. For example, it will be apparent to those skilled in the art that alignment dipoles may be disposed between the electron microscope column and the energy-dispersing device, and between the energy-dispersing device and the electron imaging device. Likewise, aberration-correcting sextupole lenses may be disposed between the electron microscope column and the energy-dispersing device, and between the energy-dispersiing device and the energy-selecting slit, where they will affect both the aberration properies of the dispersed electron energy-loss spectrum, and the distortions and aberrations of the energy-selecteed image. It will also be apparent to those skilled in the art that quadrupole lenses may be disposed between the microscope column and the energy-dispersing device, where they may serve to finely tune the first-order focussing of the energy-dispersing device, and that additional quadrupole lenses may also be disposed between the energy-dispersing device and the electron imaging device, where they may serve to increase the magnification of the energy-selected images, or to increase the dispersion of the energy-loss spectrum when the electron imaging device is used to directly observe the energy-loss spectra.

What is claimed is:

1. An apparatus for transforming an unfiltered electron image produced by a transmission electron microscope into an energy-seleeted electron image, comprising:
    (a) an energy-dispersing means transforming said unfiltered image of a thin specimen into an electron energy spectrum;
    (b) an energy-selecting means admitting only electrons of a selected range of energies within said electron energy spectrum;
    (c) a two-dimensional electron image detector;
    (d) a plurality of variable-power quadrupole lenses located between said energy-selelcting means and said image detector, said quadrupole lenses transforming said electron energy spectrum into an energy-selected image of said specimen and projecting said image onto said image detector, whereby the energy-selected image is formed only with electrons of energies admitted by the energy-selecting means; and
    (e) a means for adjusting the power of said quadrupole lenses such that said energy-selected image is free of first-order dependence on electron energy and the magnification of the image is adjustable in two perpendicular directions.

2. An apparatus as claimed in claim 1 in which said energy-dispersing means is a magnetic sector.

3. An apparatus as claimed in claim 1 in which said energy-selecting means is a metal slit of adjustable width.

4. An apparatus as claimed in claim 1 in which said electron image detector comprises an electron scintillator transforming said electron image into a light image, a fiber-optic window transferring said light image to an image sensor, said image sensor being a two-dimensional charge-coupled device.

5. An apparatus as claimed in claim 1 in which said quadrupole lenses are electromagnetic quadrupole lenses.

6. An apparatus as claimed in claim 1 further comprising a plurality of variable-power sextupole lenses interposed between said energy-selecting means and said electron image detector, said sextupole lenses minimizing aberrations dependent on second power of position in said energy-selected image.

7. An apparatus as claimed in claim 6 in which said sextupole lenses are electromagnetic sextupole lenses.

8. An apparatus for transforming an unfiltered electron image produced by a transmission electron microscope into an energy-selected electron image, comprising:

(a) a magnetic sector transforming an unfiltered electron image of a thin specimen into an electron energy spectrum;
(b) an energy-selecting slit selecting a pass-band of electron energies within said electron energy spectrum;
(c) a two-dimensional electron image detector;
(d) a plurality of variable-power electromagnetic quadrupole lenses located between said energy-selecting slit and said image detector, said quadrupole lenses transforming said pass-band of electron energies into an energy-selected image of said specimen and projecting said image onto the image detector; and
(e) a plurality of power supplies controlling the power of the quadrupole lenses.

9. An apparatus as claimed in claim 8 in which a plurality of sextupole lenses are disposed between said energy-selecting slit and said electron imaging device, said sextupole lenses minimizing second-order aberrations of said energy-selected electron image.

* * * * *